United States Patent
Li et al.

(10) Patent No.: US 11,851,756 B2
(45) Date of Patent: Dec. 26, 2023

(54) METHODS FOR DEPOSITING SILICON-CONTAINING FILMS

(71) Applicant: Versum Materials US, LLC, Tempe, AZ (US)

(72) Inventors: Ming Li, Tempe, AZ (US); Xinjian Lei, Tempe, AZ (US); Raymond N. Vrtis, Tempe, AZ (US); Robert G. Ridgeway, Tempe, AZ (US); Manchao Xiao, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 119 days.

(21) Appl. No.: 16/646,686

(22) PCT Filed: Sep. 11, 2018

(86) PCT No.: PCT/US2018/050414
§ 371 (c)(1),
(2) Date: Mar. 12, 2020

(87) PCT Pub. No.: WO2019/055393
PCT Pub. Date: Mar. 21, 2019

(65) Prior Publication Data
US 2020/0270749 A1    Aug. 27, 2020

Related U.S. Application Data

(60) Provisional application No. 62/558,621, filed on Sep. 14, 2017.

(51) Int. Cl.
*C23C 16/32* (2006.01)
*C23C 16/455* (2006.01)
*C23C 16/36* (2006.01)
*C23C 16/50* (2006.01)
C23C 16/44 (2006.01)
H01L 21/768 (2006.01)

(52) U.S. Cl.
CPC ...... *C23C 16/45553* (2013.01); *C23C 16/325* (2013.01); *C23C 16/36* (2013.01); *C23C 16/45538* (2013.01); *C23C 16/50* (2013.01); C23C 16/4408 (2013.01); H01L 21/76829 (2013.01)

(58) Field of Classification Search
CPC ........ C23C 16/45553; C23C 16/45538; C23C 16/32; C23C 16/325; C23C 16/36; C23C 16/4408
See application file for complete search history.

(56) References Cited

U.S. PATENT DOCUMENTS

| | | | | |
|---|---|---|---|---|
| 4,923,716 A | * | 5/1990 | Brown | C23C 16/325 427/249.15 |
| 5,043,773 A | * | 8/1991 | Precht | H01L 23/15 257/77 |
| 5,053,255 A | * | 10/1991 | Boeglin | C23C 16/325 427/249.15 |
| 5,061,514 A | * | 10/1991 | Boeglin | C23C 16/325 427/578 |
| 5,190,890 A | * | 3/1993 | Precht | H01L 23/15 117/97 |
| 6,926,926 B2 | * | 8/2005 | Cho | H01L 21/02167 118/728 |
| 7,754,906 B2 | * | 7/2010 | Norman | C07F 9/005 556/9 |
| 2002/0072220 A1 | * | 6/2002 | Wang | H01L 21/02126 438/623 |
| 2006/0003603 A1 | * | 1/2006 | Fukuchi | H01L 21/31662 438/787 |
| 2012/0177841 A1 | * | 7/2012 | Thompson | H01L 21/02658 427/535 |
| 2013/0065404 A1 | * | 3/2013 | Weidman | H01L 21/0262 438/786 |
| 2013/0084714 A1 | * | 4/2013 | Oka | H01L 21/02126 438/765 |

(Continued)

FOREIGN PATENT DOCUMENTS

WO    WO 2012039833 A2 *  3/2012  ............ C23C 16/32

OTHER PUBLICATIONS

Weisheim, Eugen, et al., "1,3,5-Tris[(trimethylstannyl)ethynyl]-1,3,5-trimethyl-1,3,5-trisilacyclohexane". Z. Naturforsch. 2016; 71(1)b: 81-84.*
Ovanesyan, Rafaiel, et al., "Atomic Layer Deposition of SiCxNy Using Si2Cl6 and CH3NH2 Plasma". Chemistry of Materials, 2017, 29, 6269-6278.*
Filatova, Ekaterina A., et al., "Investigating routes toward atomic layer deposition of silicon carbide: Ab initio screening of potential silicon and carbon precursors". J. Vac. Sci. Technol. A 35(1), Jan./Feb. 2017, 01B103-1 to 01B103-6.*

(Continued)

*Primary Examiner* — Bret P Chen
(74) *Attorney, Agent, or Firm* — David K. Benson

(57) ABSTRACT

Methods for forming a dielectric film comprising silicon and carbon onto at least a surface of a substrate includes introducing into a reactor one or more compounds represented by the structure of Formula IA and compounds represented by the structure of Formula IB:

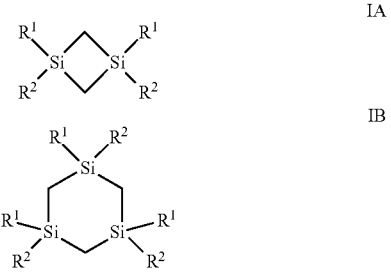

as defined herein.

21 Claims, 1 Drawing Sheet

(56) References Cited

U.S. PATENT DOCUMENTS

| | | | | |
|---|---|---|---|---|
| 2013/0217239 | A1* | 8/2013 | Mallick | H01L 21/02348 438/778 |
| 2013/0330933 | A1* | 12/2013 | Fukazawa | H01L 21/02274 438/778 |
| 2014/0023794 | A1* | 1/2014 | Mahajani | C23C 16/36 427/535 |
| 2014/0193983 | A1* | 7/2014 | LaVoie | C23C 16/45553 438/778 |
| 2015/0118394 | A1* | 4/2015 | Varadarajan | H01L 21/02167 427/249.15 |
| 2015/0329965 | A1* | 11/2015 | Gadgil | C23C 16/45553 423/290 |
| 2016/0020091 | A1* | 1/2016 | Saly | C23C 16/36 438/767 |
| 2016/0314962 | A1* | 10/2016 | Higashino | H01L 21/02274 |

OTHER PUBLICATIONS

Heo, Seung Chan, et al., "Remote plasma atomic layer deposited Al2O3 4H SiC MOS capacitor with remote H2 plasma passivation and post metallization annealing". Microelectronic Engineering 147 (2015) 239-243.*

Fraga, Mariana, et al., "Progresses in Synthesis and Application of SiC Films: From CVD to ALD and from MEMS to NEMS". Micromachines, 2020, 11, 799, pp. 1-23.*

Belyakov, Alexander V., et al., "Conformational properties of 1-cyano-1-silacyclohexane, C5H10SiHCN: Gas electron diffraction, low-temperature NMR and quantum chemical calculations". Journal of Molecular Structure 1132 (2017) 149-156.*

Rajaraman, Vijayekumar, et al., "PECVD silicon carbide surface micromachining technology and selected MEMS applications". International Journal of Advances in Engineering Sciences and Applied Mathematics, Jun. 2010, pp. 1-6.*

Xiao, Yequan, et al., "The effect of radio frequency power on the structural and optical properties of a-C:H films prepared by PECVD". J.Mater. Res., vol. 32, No. 7, Apr. 14, 2017, pp. 1231-1238.*

* cited by examiner

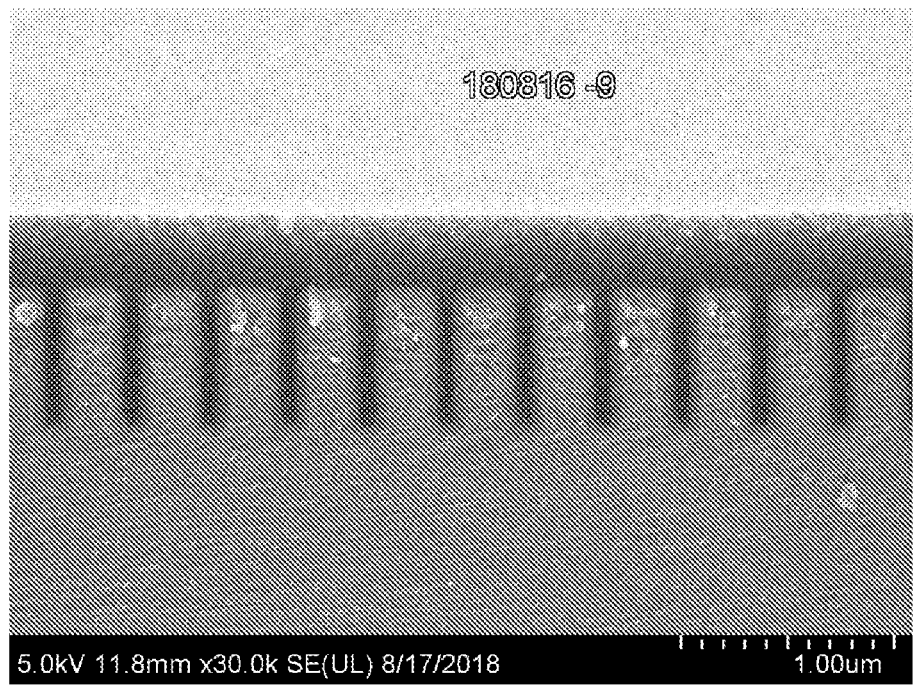

METHODS FOR DEPOSITING
SILICON-CONTAINING FILMS

CROSS-REFERENCE TO RELATED
APPLICATIONS

This application claims priority under 35 U.S.C. § 119(e) to U.S. provisional patent application No. 62/558,621, filed on Sep. 14, 2017, the entirety of which is incorporated herein by reference.

FIELD OF THE INVENTION

Described herein are methods and compositions for depositing conformal, stoichiometric or non-stoichiometric, silicon carbide or silicon carbonitride films using a silicon precursor comprising at least one silacycloalkane. More specifically, described herein are deposition processes, such as without limitation, plasma enhanced atomic layer deposition ("PEALD"), plasma enhanced cyclic chemical vapor deposition ("PECCVD"), and plasma enhanced flowable vapor deposition ("PEFCVD") using silacycloalkane precursors, and compositions comprising same, that are used to deposit dielectric films.

BACKGROUND OF THE INVENTION

Low pressure chemical vapor deposition (LPCVD) processes are one of the more widely accepted methods used by semiconductor industry for the deposition of silicon nitride films. Low pressure chemical vapor deposition (LPCVD) using ammonia may require deposition temperatures of greater than 650° C. to obtain reasonable growth rates and uniformities. Higher deposition temperatures are typically employed to provide improved film properties. One of the more common industry methods to grow silicon nitride is through low pressure chemical vapor deposition in a hot wall reactor at temperatures greater than 750° C. using the silane, dichlorosilane, and/or ammonia as precursors. However, there are several drawbacks using this method. For example, certain precursors, such as silane, are pyrophoric. This may present problems in handling and usage. Also, films deposited from dichlorosilane may contain certain impurities, such as chlorine and ammonium chloride, which are formed as byproducts during the deposition process.

U.S. Pat. No. 9,455,138 discloses a method for forming a dielectric film in a trench on a substrate by plasma-enhanced atomic layer deposition (PEALD) performs ≥1 process cycles, each process cycle including (i) feeding a silicon-containing precursor in a pulse, (ii) supplying a hydrogen-containing reactant gas at a flow rate 30~800 sccm in the absence of nitrogen-containing gas, (iii) supplying a noble gas to the reaction space, and (iv) applying RF power in the presence of the reactant gas and the noble gas and in the absence of any precursor in the reaction space, to form a monolayer constituting a dielectric film on a substrate at a growth rate of less than one at. layer thickness per cycle.

WO2012/039833A discloses methods for formation of silicon carbide on substrate are provided. Atomic layer deposition methods of forming silicon carbide are described in which a first reactant gas of the formula $Si_nH_aX_b$ wherein n=1-5, a+b=2n+2, and X=F, Cl, Br, I; and a second reactant gas of the formula $MR_{3-b}Y_b$, wherein R is a hydrocarbon containing substituent, Y is a halide, hydride or other ligand and b=1-3 are sequentially deposited on a substrate and then exposed to a plasma. The process can be repeated multiple times to deposit a plurality of silicon carbide layers.

U.S. Pat. No. 9,234,276 discloses methods and systems for providing SiC films. A layer of SiC can be provided under process conditions that employ one or more Si-containing precursors that have ≥1 Si—H bonds and/or Si—Si bonds. The Si-containing precursors may also have ≥1 Si—O bonds and/or Si—C bonds. One or more radical species in a substantially low energy state can react with the Si-containing precursors to form the SiC film. The ≥1 radical species can be formed in a remote plasma source.

U.S. Pat. No. 8,846,536 discloses a method to deposit and modify the flowable dielectric film. By one or more integration processes, the wet etch rate of the flowable dielectric film can be changed by a factor of at least 10.

Auner, N. and Grobe, J. (1980). "Silaethenes. II. Preparation and characterization of 1,3-disilacyclobutanes." J. Organomet. Chem. 188(2): 151-177. Discloses 3-Disilacyclobutanes I (R, R1=Cl, Me, Me$_2$N, CH$_2$:CH, Ph) are prepared (a) by ring synthesis from chloromethylchlorosilanes RR$^1$Si(CH$_2$Cl)Cl, (b) by thermolysis of monosilacyclobutanes II, and (c) by substitution of chlorine with alkyl groups in SiCl-containing 1,3-disilacyclobutanes, obtained by procedures (a) or (b). The synthetic methods are compared.

US Publ. No. 2013/0217241 discloses the deposition and treatment of Si—C—N containing flowable layers. Si and C may come from a Si—C-containing precursor, while N may come from an N-containing precursor. The initial Si—C—N containing flowable layer is treated to remove components that enables the flowability. Removal of these components can increase etch tolerance, reduce shrinkage, adjust film tension and electrical properties. The post treatment can be thermal annealing, UV exposure or high density plasma.

U.S. Pat. No. 8,889,566 discloses a method to deposit flowable film by exciting the silicon precursor with a local plasma and depositing with a second plasma. The silicon precursor can be silylamine, higher order silane or halogenated silane. The second reactant gas can be NH$_3$, N$_2$, H$_2$, and/or O$_2$.

U.S. Pat. No. 7,825,040 discloses a method of filling a gap by introducing an alkoxysilane or aminosilane precursor, and depositing a flowable Si-containing film by plasma reaction. The precursor doesn't contain a Si—C bond or a C—C bond.

U.S. Pat. Nos. 8,889,566, 7,521,378, and 8,575,040 describe an approach to depositing a silicon oxide film using flowable chemical vapor deposition process as gas phase polymerization. Compounds such as trisilylamine (TSA) was used to deposit Si, H, and N containing oligomers that were subsequently oxidized to SiO$_x$ films using ozone exposure.

U.S. Pat. No. 8,846,536 discloses a method to deposit and modify the flowable dielectric film. By one or more integration processes, the wet etch rate of the flowable dielectric film can be changed by a factor of at least 10.

Accordingly, there is a need in the art to provide a low temperature (e.g., processing temperature of 400° C. or below) method for depositing a conformal, high quality, silicon carbide or silicon carbonitride film wherein the film has one or more of the following characteristics: a density of 2.2 grams per cubic centimeter (g/cc) or greater, a low wet etch rate (as measured in dilute hydrofluoric acid (HF)), and combinations thereof compared to other silicon nitride films using other deposition methods or precursors.

The disclosure of the previously described patents, patent applications and publications is hereby incorporated by reference.

BRIEF SUMMARY OF THE INVENTION

Described herein are methods for forming a dielectric film comprising stoichiometric or non-stoichiometric silicon carbide, silicon carbonitride films, silicon carboxide, silicon oxycarbonitride onto at least a portion of a substrate.

In one aspect, the silicon precursors described herein comprise at least one silacycloalkane precursor selected from the group consisting of compounds represented by the structure of Formula IA and compounds represented by the structure of Formula IB:

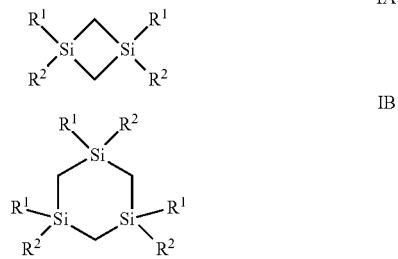

wherein $R^1$ is selected from the group consisting of hydrogen, a linear or branched $C_1$ to $C_{10}$ alkyl group, cyclic $C_3$ to $C_{10}$ alkyl group, a linear or branched $C_2$ to $C_{10}$ alkenyl group, and a linear or branched $C_2$ to $C_{10}$ alkynyl group; $R^2$ is selected from the group consisting of a linear or branched $C_2$ to $C_6$ alkenyl group, a linear or branched $C_2$ to $C_6$ alkynyl group, and cyclic $C_3$ to $C_{10}$ alkyl group.

In another aspect, there is provided a composition comprising: (a) at least one silacycloalkane precursor selected from the group consisting of compounds represented by the structure of Formula IA and compounds represented by the structure of Formula IB:

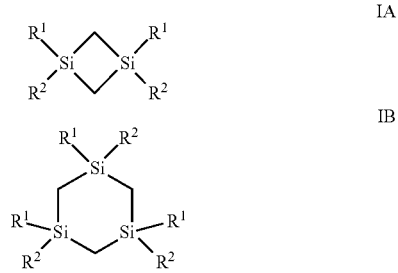

wherein $R^1$ is selected from the group consisting of hydrogen, a linear or branched $C_1$ to $C_{10}$ alkyl group, a cyclic $C_3$ to $C_{10}$ alkyl group, a linear or branched $C_2$ to $C_{10}$ alkenyl group, and a linear or branched $C_2$ to $C_{10}$ alkynyl group; and $R^2$ is selected from the group consisting of a linear or branched $C_2$ to $C_6$ alkenyl group, a linear or branched $C_2$ to $C_6$ alkynyl group, and a cyclic $C_3$ to $C_{10}$ alkyl group; and (b) a solvent. In certain embodiments of Formula I, $R^1$ and $R^2$ are each hydrogen. In other embodiments, $R^1$ is hydrogen. In certain embodiments of the composition described herein, the solvent is at least one selected from the group consisting of ether, tertiary amine, alkyl hydrocarbon, aromatic hydrocarbon, tertiary aminoether, and combinations thereof. In certain embodiments, the difference between the boiling point of the silacycloalkane and the boiling point of the solvent is 40° C. or less.

In one aspect, there is provided a method of forming a silicon carbide film, the method comprising the steps of:
a. providing a substrate in a reactor;
b. introducing into the reactor at least one silacycloalkane precursor selected from the group consisting of compounds represented by the structure of Formula IA and compounds represented by the structure of Formula IB:

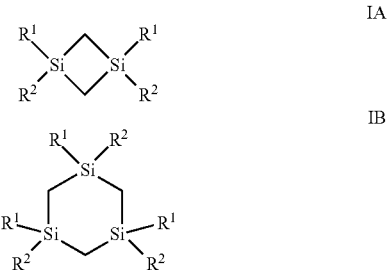

wherein $R^1$ is selected from the group consisting of hydrogen, a linear or branched $C_1$ to $C_{10}$ alkyl group, a cyclic $C_3$ to $C_{10}$ alkyl group, a linear or branched $C_2$ to $C_{10}$ alkenyl group, and a linear or branched $C_2$ to $C_{10}$ alkynyl group; and $R^2$ is selected from the group consisting of a linear or branched $C_2$ to $C_6$ alkenyl group, a linear or branched $C_2$ to $C_6$ alkynyl group, and a cyclic $C_3$ to $C_{10}$ alkyl group, wherein the at least one silacycloalkane precursor reacts on at least a portion of the surface of the substrate to provide a chemisorbed layer;
c. purging the reactor with a purge gas;
d. introducing a plasma containing source into the reactor to react with at least a portion of the chemisorbed layer and provide at least one reactive site wherein the plasma is generated at a power density ranging from about 0.01 to about 1.5 W/cm² and;
e. optionally purging the reactor with an inert gas; and wherein the steps b through e are repeated until a desired thickness of the silicon carbide film is obtained.

In another aspect, there is provided a method of forming a dielectric film comprising silicon and carbide using a deposition process selected from a plasma enhanced atomic layer deposition process or plasma enhanced ALD-like process or plasma enhanced flowable chemical vapor deposition, the method comprising the steps of:
a. providing a substrate in a reactor;
b. introducing into the reactor at least one silacycloalkane precursor selected from the group consisting of 1,3-divinyl-1,3-disilacyclobutane, 1,3-divinyl-1,3-dimethyl-1,3-disilacyclobutane, 1,1,3,3-tetravinyl-1,3-disilacyclobutane, 1,3,5-trivinyl-1,3,5-trisilacyclohexane, 1,3,5-trivinyl-1,3,5-trimethyl-1,3,5-trisilacyclohexane, 1,1,3,3,5,5-hexavinyl-1,3,5-trisilacyclohexane, 1,3-diallyl-1,3-disilacyclobutane, 1,3-diallyl-1,3-dimethyl-1,3-disilacyclobutane, 1,1,3,3-tetraallyl-1,3-disilacyclobutane, 1,3,5-triallyl-1,3,5-trisilacyclohexane, 1,3,5-triallyl-1,3,5-trimethyl-1,3,5-trisilacyclohexane, 1,1,3,3,5,5-hexaallyl-1,3,5-trisilacyclohexane, 1,3-diacetylenyl-1,3-disilacyclobutane, 1,3-diacetylenyl-1,3-dimethyl-1,3-disilacyclobutane, 1,1,3,3-tetraacetylenyl-1,3-disilacyclobutane, 1,3,5-triacetylenyl-1,3,5-trisilacyclohexane, 1,3,5- triacetylenyl-1,3,5-trimethyl-1,3,5-trisilacyclohexane, 1,1,3,3,5,5-hexaacetylenyl-1,3,5-trisilacyclohexane 1,3-dicyclopropyl-1,3-disilacyclobutane, 1,3-dicyclopropyl-1,3-dimethyl-1,3-disilacyclobutane, 1,1,3,3-tetracyclopropyl-1,3-disilacyclobutane and combinations thereof, wherein the at least one silacycloalkane precursor reacts on at least a portion of the surface of the substrate to provide a chemisorbed layer;

c. purging the reactor with a purge gas comprising at least one selected from nitrogen, a noble gas, and combinations thereof;

d. introducing a plasma containing source into the reactor to react with at least a portion of the chemisorbed layer and provide an at least one reactive site wherein the plasma is generated at a power density ranging from about 0.01 to about 1.5 W/cm$^2$; and e. optionally purging the reactor with an inert gas; and wherein the steps b through e are repeated until a desired thickness of the silicon carbide film is obtained.

In a further aspect, the invention relates to a method of forming a dielectric film comprising silicon, nitrogen, and carbon onto at least a surface of a substrate, using a at least one deposition process selected from the group consisting of, plasma enhanced atomic layer deposition process, plasma enhanced ALD-like process, and plasma enhanced flowable chemical vapor deposition, the method comprising the steps of:

a. providing a substrate in a reactor;

b. introducing into the reactor at least one silacycloalkane precursor selected from the group consisting of compounds represented by the structure of Formula IA and compounds represented by the structure of Formula IB:

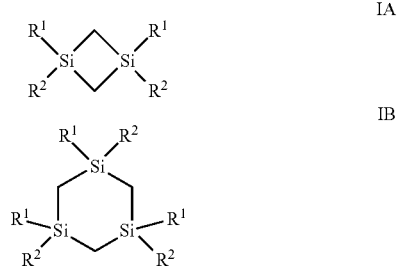

wherein R$^1$ is selected from the group consisting of hydrogen, a linear or branched C$_1$ to C$_{10}$ alkyl group, a cyclic C$_3$ to C$_{10}$ alkyl group, a linear or branched C$_2$ to C$_{10}$ alkenyl group, and a linear or branched C$_2$ to C$_{10}$ alkynyl group; and R$^2$ is selected from the group consisting of a linear or branched C$_2$ to C$_6$ alkenyl group, a linear or branched C$_2$ to C$_6$ alkynyl group, and a cyclic C$_3$ to C$_{10}$ alkyl group, wherein the at least one silacycloalkane precursor reacts on at least a portion of the surface of the substrate to provide a chemisorbed layer;

c. purging the reactor with a purge gas comprising at least one selected from nitrogen, a noble gas, and combinations thereof;

d. introducing a plasma comprising nitrogen source into the reactor to react with at least a portion of the chemisorbed layer and provide an at least one reactive site wherein the plasma is generated at a power density ranging from about 0.01 to about 1.5 W/cm$^2$; and e. optionally purging the reactor with an inert gas; and wherein the steps b through e are repeated until a desired thickness of the silicon carbonitride film is obtained.

A further aspect of the invention relates to a silicon containing film produced by any of the foregoing methods or from any of the foregoing compositions wherein the silicon carbide or silicon carbonitride film has a density of 2.2 g/cc or greater.

The aspects of the invention can be used alone or in various combinations with each other.

DESCRIPTION OF THE DRAWINGS

FIG. 1 is an SEM micrograph image of a PEFCVD film deposited from the precursor 1,1,3,3-tetravinyl-1,3-disilacyclobutane according to Example 4.

DETAILED DESCRIPTION OF THE INVENTION

The deposition of conformal, stoichiometric and non-stoichiometric silicon carbide or silicon carbonitride films at low temperature, e.g., temperatures of 400° C. or less, which meet one or more criteria to be considered a high quality film, has been a long-standing industry challenge. There are several applications in semiconductor field such as advanced patterning or spacer which require high quality films. A silicon carbide film or silicon carbonitride film is considered a "high quality" film if it has one or more of the following characteristics: a density of 2.2 grams per cubic centimeter (g/cc) or greater (e.g., about 2.2 to about 3.0 g/cc, about 2.4 to about 3.0/cc and in some cases about 2.5 to about 2.8 g/cc), a low wet etch rate (as measured in dilute hydrofluoric acid (0.5 wt % HF in DI water) in accordance with the method described below in greater detail), and combinations thereof compared to other silicon carbide or silicon carbonitride films. In these or other embodiments, the refractive index for the silicon nitride film should be 1.9 or higher (e.g., about 1.9 to about 2.4, about 2.0 to about 2.4 and in some cases about 2.0 to about 2.2) as measured by ellipsometer.

In one aspect, described herein is a composition for depositing a silicon-containing film, wherein the composition comprises: (a) at least one silacycloalkane precursor selected from the group consisting of compounds represented by the structure of Formula IA and compounds represented by the structure of Formula IB:

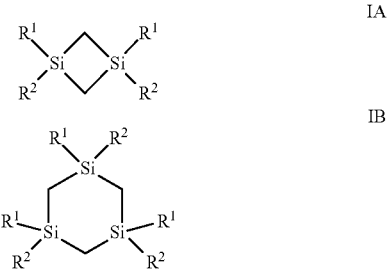

wherein R$^1$ is selected from the group consisting of hydrogen, a linear or branched C$_1$ to C$_{10}$ alkyl group, a cyclic C$_3$ to C$_{10}$ alkyl group, a linear or branched C$_2$ to C$_{10}$ alkenyl group, and a linear or branched C$_2$ to C$_{10}$ alkynyl group; and R$^2$ is selected from the group consisting of a linear or branched C$_2$ to C$_6$ alkenyl group, a linear or branched C$_2$ to C$_6$ alkynyl group, and a cyclic C$_3$ to C$_{10}$ alkyl group; and; (b) optionally, at least one solvent. In certain embodiments of the composition described herein, exemplary solvents include, without limitation, ethers, tertiary amines, alkyl hydrocarbons, aromatic hydrocarbons, tertiary aminoethers, and combinations thereof. In certain embodiments, the difference between the boiling point of the silacycloalkane and the boiling point of the solvent is 40° C. or less. The wt % of silacycloalkane precursor compound in the solvent can vary from 1 to 99 wt %, or 10 to 90 wt %, or 20 to 80 wt %, or 30 to 70 wt %, or 40 to 60 wt %, to 50 to 50 wt %. In some embodiments, the composition can be delivered via direct liquid injection into a reactor chamber for silicon-containing film.

In one embodiment, described herein is an atomic layer deposition (ALD) or ALD-like method at a low temperature, or one or more deposition temperatures ranging from about 25° C. to about 400° C., using a silacycloalkane precursor having Formula IA or IB described herein in a plasma process which comprises nitrogen and optionally a noble gas.

Described herein are methods for forming a stoichiometric or non-stoichiometric silicon carbide or silicon carbonitride film comprising silicon and nitrogen onto at least a portion of a substrate. In certain embodiments, the silicon carbide or silicon carbonitride film further comprises oxygen such as a silicon oxynitride film. In this or other embodiments, the silicon carbide film comprises oxygen and nitrogen such as a silicon carboxynitride film with oxygen content ranging from 0.1 to 30 at. % and carbon content ranging from 0.1 to 40 at. % measured by XPS.

Exemplary silacycloalkane precursors having a structure represented by Formula IA or IB, include, but are not limited to, the following precursors shown in Table 1.

TABLE 1

Precursors having
Formula IA or IB

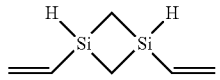

1,3-divinyl-1,3-
disilacyclobutane

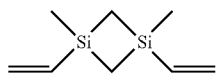

1,3-divinyl-
1,3-dimethyl-
1,3-disilacyclobutane

1,1,3,3-tetravinyl-
1,3-disilacyclobutane

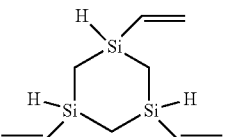

1,3,5-trivinyl-1,3,5-
trisilacyclohexane

TABLE 1-continued

Precursors having
Formula IA or IB

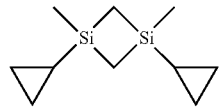

1,3-dicyclopropyl-
1,3-dimethyl-1,3-
disilacyclobutane

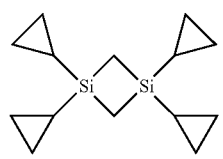

1,1,3,3-tetracyclopropyl-
1,3-disilacyclobutane

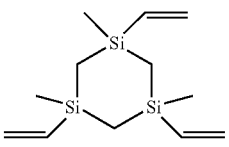

1,3,5-trivinyl-1,3,5-
trimethyl-1,3,5-
trisilacyclohexane

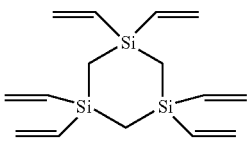

1,1,3,3,55-hexavinyl-
1,3,5-trisilacyclohexane

1,3-diacetylenyl-1,3-
disilacyclobutane

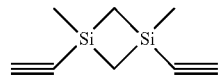

1,3-diacetylenyl-
1,3-dimethyl-1,3-
disilacyclobutane

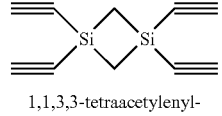

1,1,3,3-tetraacetylenyl-
1,3-disilacyclobutane

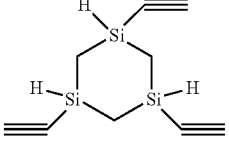

1,3,5-triacetylenyl-
1,3,5-trisilacyclohexane

TABLE 1-continued

Precursors having
Formula IA or IB 1,3,5-triacetylenyl-
1,3,5-trimethyl-
1,3,5-trisilacyclohexane 1,1,3,3,55-hexaacetylenyl-
1,3,5-trisilacyclohexane The silacycloalkane precursors having a structure represented by Formula IA or IB described herein exhibit a balance of reactivity and stability that makes them ideally suited as PEALD or PECCVD or PEFCVD precursors for semiconductor device manufacturing processes. With regard to reactivity, certain precursors may have boiling points (e.g., greater than about 200° C.) that are too high to be vaporized and delivered to the reactor to be deposited as a film on a substrate. Precursors having higher relative boiling points require that the delivery container and lines need to be heated at or above the boiling point of the precursor under a given vacuum to prevent condensation or particles from forming in the container, lines, or both. Importantly, the silacycloalkane precursors having a structure represented by Formula IA or IB possess at least two carbon-carbon double or triple bonds or at least two cyclic alkane groups are better and, therefore, it is believed enabling deposition of silicon carbide via crossing link or polymerization of the carbon-carbon double or triple bonds or the cyclic alkane groups, especially cyclopropyl under plasma conditions. In certain embodiments, the silacycloalkane precursors having a structure represented by Formula IA or IB described herein comprise 2% or less by weight, or 1% or less by weight, or 0.5% or less by weight of by-product (after being stored for a time period of 6 months or greater, or one year or greater) which is indicative of being shelf stable. In certain embodiments, the silacycloalkane precursors having a structure represented by Formula IA or IB described herein comprise 100 ppm or less of halide impurity such as chloride, or 50 ppm or less of halide impurity, or 10 ppm or less of halide impurity. In addition to the foregoing advantages, in certain embodiments, such as for depositing a silicon carbide or silicon carbonitride film using PEALD, or PECCVD or PEFCVD deposition method, the silacycloalkane precursor described herein may be able to deposit high density materials at one or more deposition temperatures, e.g., 400° C. or less, 350° C. or less, 300° C. or less, or 250° C. or less, 200° C. or less, 150° C. or less, 100° C. or less, or 50° C. or less.

Throughout the description, the term "alkyl hydrocarbon" refers a linear or branched $C_6$ to $C_{20}$ hydrocarbon, cyclic $C_6$ to $C_{20}$ hydrocarbon. Exemplary hydrocarbons include, but are not limited to, hexane, heptane, octane, nonane, decane, dodecane, cyclooctane, cyclononane, cyclodecane, and mixtures thereof.

Throughout the description, the term "aromatic hydrocarbon" refers a $C_6$ to $C_{20}$ aromatic hydrocarbon. Exemplary aromatic hydrocarbons include, but are not limited to, toluene and mesitylene.

In Formula IA or IB and throughout the description, the term "cyclic alkyl" denotes a cyclic functional group having from 3 to 10 or from 4 to 10 carbon atoms or from 5 to 10 carbon atoms. Exemplary cyclic alkyl groups include, but are not limited to, cyclopropyl, cyclobutyl, cyclopentyl, cyclohexyl, and cyclooctyl groups, preferably cyclopropyl due to high reactivity.

In Formula IA or IB and throughout the description, the term "aryl" denotes an aromatic cyclic functional group having from 5 to 12 carbon atoms or from 6 to 10 carbon atoms. Exemplary aryl groups include, but are not limited to, phenyl, benzyl, chlorobenzyl, tolyl, and o-xylyl.

In Formula IA or IB and throughout the description, the term "alkyl" denotes a linear, or branched functional group having from 1 to 10 or 1 to 4 carbon atoms. Exemplary alkyl groups include, but are not limited to, methyl, ethyl, n-propyl, isopropyl, n-butyl, isobutyl, sec-butyl, tert-butyl, n-pentyl, iso-pentyl, tert-pentyl, hexyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto.

In Formula IA or IB and throughout the description, the term "alkenyl group" denotes a group which has one or more carbon-carbon double bonds and has from 2 to 10 or from 2 to 6 or from 2 to 4 carbon atoms. Exemplary alkenyl groups include, but are not limited to, vinyl ($CH_2$=CH—) or allyl ($CH_2$=$CHCH_2$—).

In Formula IA or IB and throughout the description, the term "alkynyl group" denotes a group which has one or more carbon-carbon triple bonds and has from 2 to 10 or from 2 to 6 or from 2 to 4 carbon atoms. An exemplary alkynyl group includes ethynyl (acetylenylenyl).

Throughout the description, the term "organoamine" as used herein describes organic compound has at least one nitrogen atom. Examples of organoamine include, but are not limited to, methylamine, ethylamine, propylamine, iso-propylamine, tert-butylamine, sec-butylamine, tert-amylamine, ethylenediamine, dimethylamine, trimethylamine, diethylamine, and triethylamine.

In certain embodiments, one or more of the alkyl group, alkenyl group, alkynyl group, alkoxy group, dialkylamino group, aryl group, and/or electron withdrawing group in Formula IA or IB may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous. An exemplary substituted substituent includes, but is not limited to, a linear or branched $C_1$ to $C_6$ fluorinated alkyl group. In one particular embodiment, at least one of $R^1$ through $R^4$ is a linear or branched $C_1$ to $C_6$ fluorinated alkyl group. In other embodiments, one or more of the alkyl group, alkenyl group, alkynyl group, alkoxy group, dialkylamino aryl group, and/or electron withdrawing group in Formula IA or IB is unsubstituted.

In certain embodiments, the silacycloalkane precursors having a structure represented by Formula IA or IB can be prepared by reacting 1,3-dihalido-1,3-dialkyl-1,3-disilacyclobutane, or 1,1,3,3-tetrahalido-1,3-disilacyclobutane or 1,3,5-trihalido-1,3,5-triaklyl-1,3,5-trisilacyclohexane or 1,1-dihalido-3,3-dialkyl-1,3-disilacyclobutane with various metal alkyl reagents such as $XMR^2$ such as M=magnesium in an organic solvent or solvent mixture as equations (1) to (3).

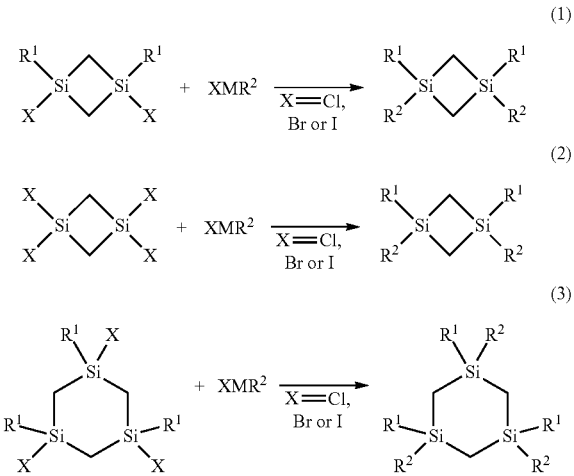

In Equations (1)-(2) $R^1$ and $R^2$ are the same as in the substituents described in Formula I and X is selected from the group consisting of chloride, bromide, and iodide. The following Equations (1)-(3) provide a non-limiting examples of the reaction schemes or synthesis routes which may be used to make the silacycloalkane precursors having a structure represented by Formula IA or IB as described herein. The reactions in Equations (1) to (3) can be conducted with (e.g., in the presence of) or without (e.g., in the absence of) organic solvents. In embodiments wherein an organic solvent is used, examples of suitable organic solvents include, but are not limited to, hydrocarbon such as hexanes, octane, toluene, and ethers such as diethylether and tetrahydrofuran (THF). In these or other embodiments, the reaction temperature is in the range of from about −70° C. to the boiling point of the solvent employed if a solvent is used. The resulting silacycloalkanes can be purified, for example, via vacuum distillation or sublimation after removing all by-products as well as any solvent(s) if present. Equations (1) to (2) are two examples of the synthetic routes to make the silacycloalkane precursors having a structure represented by Formula I A or IB. Other synthetic routes involving cyclization can also be employed.

The silacycloalkane precursors having a structure represented by Formula IA or IB are preferably substantially free of halide ions such as chloride or metal ions such as Al. As used herein, the term "substantially free" as it relates to halide ions (or halides) such as, for example, chlorides and fluorides, bromides, iodides, metal ions such as $L^+$, $Mg^{2+}$, $Al^{3+}$, $Fe^{2+}$, $Fe^{3+}$, $Ni^{2+}$, $Cr^{3+}$ means less than 5 ppm (by weight) measured by ion chromatography (IC) or ICP-MS, preferably less than 3 ppm measured by ion chromatography (IC) or ICP-MS, and more preferably less than 1 ppm measured by ion chromatography (IC) or ICP-MS, and most preferably 0 ppm b measured by ion chromatography (IC). Chlorides or metal ions are known to act as decomposition catalysts for the silacycloalkane precursors. Significant levels of chloride in the final product can cause the silacycloalkane precursors to degrade. The gradual degradation of the silacycloalkane precursors may directly impact the film deposition process making it difficult for the semiconductor manufacturer to meet film specifications. In addition, the shelf-life or stability is negatively impacted by the higher degradation rate of the silacycloalkane precursors thereby making it difficult to guarantee a 1-2 year shelf-life. Therefore, the accelerated decomposition of the silacycloalkane precursors presents safety and performance concerns related to the formation of these flammable and/or pyrophoric gaseous byproducts.

In some embodiments, added to the distilled silacycloalkane precursors having a structure represented by Formula IA or IB is a stabilizer compound or polymerization inhibitor. Exemplary stabilizer compounds include 2,6-di-tert-butyl-4-methyl phenol (or BHT for butylhydroxytoluene), 2,2,6,6-tetramethyl-1-piperidinyloxy (TEMPO), 2-tert-butyl-4-hydroxyanisole, 3-tert-butyl-4-hydroxyanisole, propyl ester 3,4,5-trihydroxy-benzoic acid, 2-(1,1-dimethyl-ethyl)-1,4-benzenediol, diphenylpicrylhydrazyl, 4-tert-butylcatechol, tert-butylhydroquinone, 1,4-benzoquinone, 6-tert-butyl-2,4-xylenol, 2,6-di-tert-butyl-p-cresol, 2,6-di-tert-butylphenol, 1,1-diphenyl-2-picrylhydrazyl free radical, hydroquinone, 4-methoxyphenol, phenothiazine, N-methyl-aniline, p-methoxydiphenylamine, diphenylamine, N,N'-di-phenyl-p-phenylenediamine, p-hydroxydiphenylamine, phenol, octadecyl-3-(3,5-di-tert-butyl-4-hydroxyphenyl) propionate, tetrakis (methylene (3,5-di-tert-butyl)-4-hy-droxy-hydrocinnamate) methane, phenothiazines, alkylami-donoisoureas, thiodiethylene bis (3,5,-di-tert-butyl-4-hy-droxy-hydrocinnamate, 1,2,-bis (3,5-di-tert-butyl-4-hydroxyhydrocinnamoyl) hydrazine, tris (2-methyl-4-hydroxy-5-tert-butylphenyl) butane, cyclic neopentanetetrayl bis (octadecyl phosphite), 4,4'-thiobis (6-tert-butyl-m-cresol), 2,2'-methylenebis (6-tert-butyl-p-cresol), oxalyl bis (benzylidenehydrazide), and naturally occurring antioxidants such as raw seed oils, wheat germ oil, tocopherols and gums. The function of the stabilizer compound or polymerization inhibitor is to prevent self-polymerization or oligomerization of silacycloalkane precursor. The amount of stabilizer compound or polymerization inhibitor is in the range from about 0.01 to about 10000 ppm, preferably from about 0.01 to about 500 ppm, and most preferably from about 0.01 to about 100 ppm based on gas chromatography analysis (GC). Important selected stabilizer compound or polymerization inhibitor should be volatile and not leave some residue in the line or injector during delivery from a container to CVD chamber via direct liquid injection.

The method used to form the silicon carbide or silicon carbonitride films or coatings are deposition processes. Examples of suitable deposition processes for the method disclosed herein include, but are not limited to, plasma enhanced ALD (PEALD) or plasma enhanced cyclic CVD (PECCVD) or plasma enhanced flowable chemical vapor deposition process. As used herein, the term "chemical vapor deposition processes" refers to any processes wherein a substrate is exposed to one or more volatile precursors, which are reacted and/or decomposed on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the silicon nitride film is deposited using an ALD process. In another embodiment, the silicon nitride film is deposited using a CCVD process. In a further embodiment, the silicon nitride film is deposited using a thermal CVD process. The term "reactor" as used herein, includes without limitation, reaction chamber or deposition chamber. The ALD-like process is defined herein as a cyclic CVD process that provides a high conformal silicon nitride film such as, silicon nitride or silicon carbonitride on a substrate as shown by having at least one of the following: percentage of non-uniformity of about 10% or less (e.g., about 1 to about 10%, about 1 to about 5% and in some cases about 1 to about 3%), as measured by ellipsometer, a deposition rate of 1 Å or greater per cycle (e.g., about 1 to about 4 Å per cycle, about 1 to about 3 Å per cycle and in some cases about 1 to about 2 Å per cycle), or a combination thereof.

In certain embodiments, the method disclosed herein avoids pre-reaction of the precursors by using PEALD or PECCVD or PEFCVD methods that separate the precursors prior to and/or during the introduction to the reactor. In this connection, deposition techniques such as PEALD or PECCVD or PEFCVD processes are used to deposit the silicon nitride film. In one embodiment, the film is deposited via a PEALD process by exposing the substrate surface alternatively to the one or more the silicon nitride precursor, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

In certain embodiments, the method described herein further comprises one or more additional silicon precursors other than the silacycloalkane precursor having a structure represented by Formula IA or IB. Examples of additional silicon nitride precursors include, but are not limited to, monochlorosilane, dichlorosilane, hexachlorodisilane, di-iso-propylaminosilane, di-sec-butylaminosilane, bis(tert-butylamino)silane, bis(diethylamino)silane, tris(dimethylamino)silane, bis-diisopropylaminodisilane, trisilylamine, and bis(disilylamino)silane.

Depending upon the deposition method, in certain embodiments, the at least one silacycloalkane precursors may be introduced into the reactor at a predetermined molar volume, or from about 0.1 to about 1000 micromoles. In this or other embodiments, the at least one silacycloalkane precursor may be introduced into the reactor for a predetermined time period. In certain embodiments, the time period ranges from about 0.001 to about 500 seconds. In yet another embodiment, the at least one silacycloalkane may be introduced at a fixed flow rate, in the range of 100 mg/minute to 5 g/minute.

In certain embodiments, the silicon nitride films comprise silicon and nitrogen. In these embodiments, the silicon nitride films deposited using the methods described herein are formed in the presence of nitrogen-containing source. A nitrogen-containing source may be introduced into the reactor in the form of at least one nitrogen-containing source and/or may be present incidentally in the other precursors used in the deposition process. Suitable nitrogen-containing source gases may include, for example, nitrogen/argon plasma. In certain embodiments, the nitrogen-containing source comprises nitrogen/argon plasma source gas that is introduced into the reactor at a flow rate ranging from about 1 to about 2000 standard cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In the method described herein, a nitrogen-containing plasma comprising a nitrogen containing gas such as, without limitation, nitrogen and optionally a noble gas can be generated in situ or remotely, preferably a noble gas with an atomic mass greater than nitrogen's atomic mass (i.e., 28 amu). The presence of a noble gas with atomic mass greater than nitrogen's atomic mass is believed to create more atomic nitrogen radicals. The nitrogen plasma source gas is introduced into the reactor at a flow rate ranging from about 1 to about 2000 square cubic centimeters (sccm) or from about 1 to about 1000 sccm or more. The nitrogen containing plasma can be introduced for a time that ranges from about 0.01 to about 100 seconds or more. In embodiments, the precursor pulse can have a pulse duration that is greater than 0.01 seconds, and the nitrogen-containing plasma can have a pulse duration that is less than 0.01 seconds, while the water pulse duration can have a pulse duration that is less than 0.01 seconds. In yet another embodiment, the purge duration between the precursor pulse and nitrogen plasmas that can be as low as 0 seconds. In yet another embodiment, a hydrogen plasma can be generated in situ or remotely using pure hydrogen ($H_2$)) mixed with a noble gas when a hydrogen plasma can be employed. The weight percentage of the noble gas in the plasma containing both nitrogen and noble gas can vary from 1 wt % to 99 wt % whereas the weight percentage of the noble gas in the plasma containing both hydrogen and noble gas can also vary from 1 wt % to 99 wt %. In yet another embodiment, an ammonia plasma can be generated in situ or remotely using pure ammonia ($NH_3$)) mixed with a noble gas when a ammonia plasma can be employed. The weight percentage of the noble gas in the plasma containing both ammonia and noble gas can also vary from 1 wt % to 99 wt %.

The deposition methods described herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon (Ne), hydrogen ($H_2$), and mixtures thereof. In certain embodiments, the inert gas that is used as a purge gas comprises a noble gas. The term "noble gas" as used herein means those gases found in Group 18 of the Periodic Table and include, helium (He), neon (Ne), argon (Ar), Xenon (Xe), krypton (Kr), and mixtures thereof. In one particular embodiment, the noble gas used as a purge gas comprises argon. In this or other embodiments, the purge gas comprising Ar is supplied into the reactor at a flow rate ranging from about 10 to about 2000 sccm for about 0.1 to 1000 seconds, thereby purging the unreacted precursor material and any byproduct that may remain in the reactor.

The respective step of supplying the precursors, the nitrogen-containing source, and/or other precursors, source gases, and/or reagents may be performed by changing the time for supplying them to change the stoichiometric composition of the resulting silicon nitride film.

Energy is applied to the at least one of the precursor, nitrogen-containing source, reducing agent, other precursors or combination thereof to induce reaction and to form the silicon nitride film or coating on the substrate. Such energy can be provided by, but not limited to, thermal, plasma, pulsed plasma, helicon plasma, high density plasma, inductively coupled plasma, X-ray, e-beam, photon, remote plasma methods (including remote microwave plasma), and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The silacycloalkane precursors may be delivered to the reaction chamber such as a PEALD or PECCVD or PEFCVD reactor either single wafer or batch in a variety of ways such as bubbling, vapor draw, or direct liquid injection (DLI). In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate. Exemplary solvents can include, without limitation, ether, tertiary amine, alkyl hydrocarbon, aromatic hydrocarbon, tertiary aminoether, and combinations thereof. In certain embodiments, the difference between the boiling point of the silacycloalkane precursor having Formula IA or IB and the boiling point of the solvent is 40° C. or less. The wt % of the silacycloalkane precursor compound in the solvent can vary from 1 to 99 wt %, or 10 to 90 wt %, or 20 to 80 wt %, or 30 to 70 wt %, or 40 to 60 wt %, or 50 to 50 wt %. In some embodiments, the composition can be delivered via direct liquid injection into a reactor chamber for silicon-containing film.

In certain embodiments, the gas lines connecting from the precursor canisters to the reaction chamber are heated to one or more temperatures depending upon the process requirements and the container of the silacycloalkane precursor having the structure represented by Formula IA or IB described herein is kept at one or more temperatures for bubbling. In other embodiments, a solution comprising the at least one silicon nitride precursor having the formula described herein is injected into a vaporizer kept at one or more temperatures for direct liquid injection.

A flow of argon, noble, and/or other inert gas may be employed as a carrier gas to help deliver the vapor of the at least one silacycloalkane precursor to the reaction chamber during the precursor pulsing. In certain embodiments, the reaction chamber process pressure is about 2 Torr or less. In other embodiments, the reaction chamber process pressure is about 10 Torr or less.

In a typical PEALD or PECCVD or PEALD-like process or PEFCVD, a substrate such as, without limitation, a silicon oxide, polysilicon, silicon doped with germanium, silicon doped with boron, germanium, carbon doped silicon oxide, flexible substrate, or metal nitride substrate is heated on a heater stage in a reaction chamber that is exposed to the silicon nitride precursor initially to allow the silacycloalkane to chemically adsorb onto the surface of the substrate. A purge gas such as nitrogen, argon, or other inert gas purges away unabsorbed excess silacycloalkane from the process chamber. After sufficient purging, an nitrogen-containing source may be introduced into reaction chamber to react with the absorbed surface followed by another gas purge to remove reaction by-products from the chamber. The process cycle can be repeated to achieve the desired film thickness. In other embodiments, pumping under vacuum can be used to remove unabsorbed excess silacycloalkane from the process chamber, after sufficient evacuation under pumping, a plasma source may be introduced into reaction chamber to react with the absorbed surface followed by another pumping down purge to remove reaction by-products from the chamber.

In one aspect, there is provided a method of forming a dielectric film comprising silicon and carbon, the method comprising the steps of:
a. providing a substrate in a reactor;
b. introducing into the reactor at least one silacycloalkane precursor selected from the group consisting of compounds represented by the structure of Formula IA and compounds represented by the structure of Formula IB:

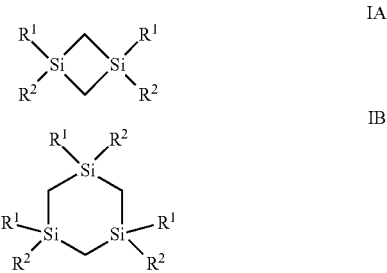

wherein $R^1$ is selected from the group consisting of hydrogen, a linear or branched $C_1$ to $C_{10}$ alkyl group, a cyclic $C_3$ to $C_{10}$ alkyl group, a linear or branched $C_2$ to $C_{10}$ alkenyl group, and a linear or branched $C_2$ to $C_{10}$ alkynyl group; and $R^2$ is selected from the group consisting of a linear or branched $C_2$ to $C_6$ alkenyl group, a linear or branched $C_2$ to $C_6$ alkynyl group, and a cyclic $C_3$ to $C_{10}$ alkyl group, wherein the at least one silacycloalkane precursor reacts on at least a portion of the surface of the substrate to provide a chemisorbed layer;

c. purging the reactor with a purge gas;
d. introducing a plasma containing source into the reactor to react with at least a portion of the chemisorbed layer and provide at least one reactive site wherein the plasma is generated at a power density ranging from about 0.01 to about 1.5 W/cm² and;
e. optionally purging the reactor with an inert gas; and wherein the steps b through e are repeated until a desired thickness of the silicon carbide film is obtained; and A flow of argon, noble, and/or other inert gas may be employed as a carrier gas to help deliver the vapor of the at least one silacycloalkane precursor to the reaction chamber during the precursor pulsing. In certain embodiments, the reaction chamber process pressure is about 10 Torr or less. In other embodiments, the reaction chamber process pressure is about 2 Torr or less. In certain embodiments of the method, the plasma comprises hydrogen which is selected from the group consisting of hydrogen plasma, hydrogen/ helium, hydrogen/argon plasma, hydrogen/neon plasma and mixtures thereof. In some embodiments, plasma comprises inert gas which is selected from the group consisting of helium plasma, argon plasma, neon plasma and mixtures thereof.

In a further aspect, the invention relates to a method of forming a dielectric film comprising silicon, nitrogen, and carbon onto at least a surface of a substrate, the method comprising the steps of:
a. providing a substrate in a reactor;
b. introducing into the reactor at least one silacycloalkane precursor selected from the group consisting of compounds represented by the structure of Formula IA and compounds represented by the structure of Formula IB:

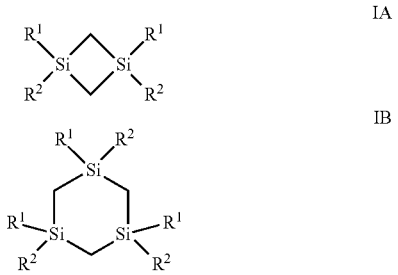

IA

IB wherein $R^1$ is selected from the group consisting of hydrogen, a linear or branched $C_1$ to $C_{10}$ alkyl group, a cyclic $C_3$ to $C_{10}$ alkyl group, a linear or branched $C_2$ to $C_{10}$ alkenyl group, and a linear or branched $C_2$ to $C_{10}$ alkynyl group; and $R^2$ is selected from the group consisting of a linear or branched $C_2$ to $C_6$ alkenyl group, a linear or branched $C_2$ to $C_6$ alkynyl group, and a cyclic $C_3$ to $C_{10}$ alkyl group, wherein the at least one silacycloalkane precursor reacts on at least a portion of the surface of the substrate to provide a chemisorbed layer;
c. purging the reactor with a purge gas comprising at least one selected from nitrogen, a noble gas, and combinations thereof;
d. introducing a plasma comprising nitrogen source into the reactor to react with at least a portion of the chemisorbed layer and provide an at least one reactive site wherein the plasma is generated at a power density ranging from about 0.01 to about 1.5 W/cm$^2$; and
e. optionally purging the reactor with an inert gas; and wherein the steps b through e are repeated until a desired thickness of the silicon nitride film is obtained. In some embodiments, the plasma comprising nitrogen source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine, dialkylhydrazine, nitrogen plasma, nitrogen/hydrogen, nitrogen/helium, nitrogen/argon plasma, ammonia plasma, nitrogen/ammonia plasma, ammonia/helium plasma, ammonia/argon plasma, ammonia/nitrogen plasma, NF$_3$ plasma, organoamine plasma, and mixtures thereof. In other embodiments, the plasma is selected from the group consisting of hydrogen plasma, helium plasma, neon plasma, argon plasma, xenon plasma, hydrogen/helium plasma, hydrogen/argon plasma and mixtures thereof.

The above steps define one cycle for the method described herein and the cycle can be repeated until the desired thickness of a silicon nitride film is obtained. In this or other embodiments, it is understood that the steps of the methods described herein may be performed in a variety of orders, may be performed sequentially or concurrently (e.g., during at least a portion of another step), and any combination thereof. The respective step of supplying the precursors and oxygen-containing source may be performed by varying the duration of the time for supplying them to change the stoichiometric composition of the resulting silicon nitride film, although always using nitrogen in less than a stoichiometric amount relative to the available silicon.

In a further aspect, the present invention relates to a method of forming a dielectric film comprising silicon, carbon, nitrogen and hydrogen onto a surface of substrate or into a feature etched into the substrate surface, the method comprising the steps of:
a. providing a substrate in a reactor;
b. introducing into the reactor at least one silacycloalkane precursor selected from the group consisting of compounds represented by the structure of Formula IA and compounds represented by the structure of Formula IB:

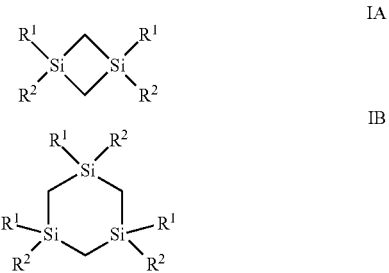

IA

IB wherein $R^1$ is selected from the group consisting of hydrogen, a linear or branched $C_1$ to $C_{10}$ alkyl group, a cyclic $C_3$ to $C_{10}$ alkyl group, a linear or branched $C_2$ to $C_{10}$ alkenyl group, and a linear or branched $C_2$ to $C_{10}$ alkynyl group; and $R^2$ is selected from the group consisting of a linear or branched $C_2$ to $C_6$ alkenyl group, a linear or branched $C_2$ to $C_6$ alkynyl group, and a cyclic $C_3$ to $C_{10}$ alkyl group, wherein the at least one silacycloalkane precursor reacts with free radicals generated from a remote plasma source.

The silacycloalkane precursor is delivered to the process chamber through vapor phase withdraw from the liquid or delivered as a liquid to heated injector that vaporizes the liquid, which is swept away by a carrier gas into a dual plenum shower head that isolates the silacycloalkane precursor from the free radicals prior to entering the process space above the substrate. At the same time the RPS is used to dissociate reactants such as ammonia (NH$_3$) and these reactive radicals are delivered to the process chamber through separate holes in the showerhead allowing them to react with the silacycloalkane precursor to generate reactive species which may be oligomers that upon striking the cooled substrate condense and flow into the etched features. In certain embodiments this process may be repeated to improve the flowability into the features.

After deposition of the flowable film, the wafer is subsequently heated to a temperature of from about 200° C. to about 400° C., preferably 300° C. to evaporate low molecular weight reactive species. Subsequent exposure to higher energy sources such as UV are used to densify and crosslink the film. PEFCVD films tend to have densities in the range of 1.2-2.2 g/cm$^3$.

In certain embodiments of the method described herein, steps b to e are repeated to provide a dielectric film comprising silicon and carbon or a dielectric film comprising silicon, nitrogen, and carbon with a thickness ranging from about 0.1 to about 500 Å, or from about 0.1 to about 5 Å, or from about 0.1 to about 10 Å, or about 0.1 to about 50 Å, or 0.1 to 100 Å. In one particular embodiment of the method described herein, a plasma comprising hydrogen can be inserted before step d to help removing hydrocarbon generated from the reaction between the silacycloalkane and the surface. The plasma comprising hydrogen is selected from the group consisting of hydrogen plasma, hydrogen/helium, hydrogen/argon plasma, hydrogen/neon plasma and mixtures thereof.

In one aspect, there is provided a method for depositing a dielectric film comprising silicon and carbon via plasma enhanced flowable chemical vapor deposition, the method comprising:

placing a substrate comprising a surface feature into a reactor which is at one or more temperatures ranging from −20° C. to about 200° C.;

introducing into the reactor at least one silacycloalkane precursor selected from the group consisting of compounds represented by the structure of Formula IA and compounds represented by the structure of Formula IB:

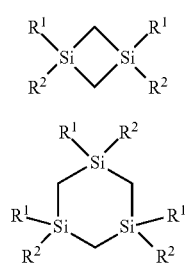

wherein $R^1$ is selected from the group consisting of hydrogen, a linear or branched $C_1$ to $C_{10}$ alkyl group, cyclic $C_3$ to $C_{10}$ alkyl group, a linear or branched $C_2$ to $C_{10}$ alkenyl group, and a linear or branched $C_2$ to $C_{10}$ alkynyl group; and $R^2$ is selected from the group consisting of a linear or branched $C_2$ to 06 alkenyl group, a linear or branched $C_2$ to 06 alkynyl group, and a cyclic $C_3$ to $C_{10}$ alkyl group; and providing a plasma source into the reactor to at least partially react the first and second compounds to form a flowable liquid, wherein the flowable liquid at least partially fills a portion of the surface feature. The flowable liquid comprises at least one oligomer.

The above steps define one cycle for the methods described herein; and the cycle can be repeated until the desired thickness of a silicon-containing film is obtained. In one particular embodiment, the substrate temperatures is from about −20° C. to about 200° C., and preferably, from about −20° C. to about 100° C. or less to keep the resulting polymeric species having small molecular weight than those formed at higher temperatures, thus more flowable to allow smaller features being filled. In this embodiment, the plasma source can be generated in situ or remotely. When a remote plasma source is employed, the plasma has to deliver into the process chamber through holes in the showerhead that are independent of the delivery of vapors of the silacycloalkane precursor. In some of this embodiment, one plasma source either in situ or remote is employed, In other of this embodiment, both in situ and remote plasma can be employed. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film.

In one aspect, there is provided a method for depositing a dielectric film comprising silicon and carbon or a dielectric film comprising silicon, nitrogen, and carbon via plasma enhanced flowable chemical vapor deposition, the method comprising:

placing a substrate comprising a surface feature into a reactor which is at one or more temperatures ranging from −20° C. to about 400° C.;

introducing into the reactor at least one silacycloalkane precursor selected from the group consisting of compounds represented by the structure of Formula IA and compounds represented by the structure of Formula IB:

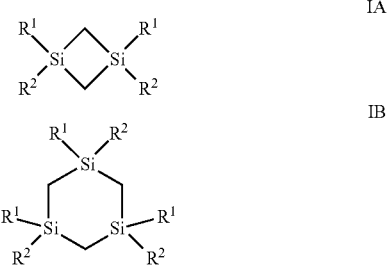

wherein $R^1$ is selected from the group consisting of hydrogen, a linear or branched $C_1$ to $C_{10}$ alkyl group, a cyclic $C_3$ to $C_{10}$ alkyl group, a linear or branched $C_2$ to $C_{10}$ alkenyl group, and a linear or branched $C_2$ to $C_{10}$ alkynyl group; and $R^2$ is selected from the group consisting of a linear or branched $C_2$ to $C_6$ alkenyl group, a linear or branched $C_2$ to $C_6$ alkynyl group, and a cyclic $C_3$ to $C_{10}$ alkyl group;

introducing into the reactor a second compound having at least one Si—H bond wherein the at least one second compound is selected from the group consisting of the following Formula IIA to IIH and III:

IIA. a polysilane compound having a formula of $Si_xH_{2x+2}$ wherein x is a number from 2 to 6;

IIB. a compound having the formula $R^1{}_mSiH_{4-m}$ wherein $R^1$ is selected from hydrogen and a linear or branched $C_1$ to $C_{10}$ alkyl group; and m is a number selected from 1, 2 and 3;

IIC. a compound having the formula $SiH_3$—$R^2$—$SiH_3$ wherein $R^2$ is a linear or branched $C_1$ to $C_6$ alkylene group;

IID. a compound having the formula $R^3SiH_2$—$R^2$—$SiH_2R^4$ wherein $R^2$ is a linear or branched $C_1$ to $C_6$ alkylene group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group;

IIE. a compound having the formula $(R^3R^4N)_nSiH_{3-n}R^1$ wherein $R^1$ is selected from hydrogen and a linear or branched $C_1$ to $C_{10}$ alkyl group; $R^3$ is selected from hydrogen, a linear or branched $C_1$ to $C_{10}$ alkyl group, and a $C_4$ to $C_{10}$ aryl group; and $R^4$ is selected from a linear or branched $C_1$ to $C_{10}$ alkyl group;

IIF. a silacycloalkyl compound such as 1,3-disilacyclobutane or its derivatives or 1,3,5-trisilacyclohexane and its derivatives;

IIG. a trisilylamine compound or derivatives thereof; and

IIH. a silazane compound having the formula of $[(R^3R^4N)_pSiH_{3-p}]_2NR^1$ or $[R^3_pSiH_{2-p}NR^1]_q$ wherein $R^1$ is selected from hydrogen and a linear or branched $C_1$ to $C_{10}$ alkyl group; $R^3$ is selected from hydrogen, a branched $C_1$ to $C_{10}$ alkyl group, and a $C_4$ to $C_{10}$ aryl group; and $R^4$ is selected from a linear or branched $C_1$ to $C_{10}$ alkyl group; p=0, 1, 2; q=2 or 3; and III. an organoaminodisilanes having the formula of $(R^3R^4N)SiH_2SiH_3$ wherein $R^3$ is selected from hydrogen, a branched $C_1$ to $C_{10}$ alkyl group, and a $C_4$ to $C_{10}$ aryl group; and $R^4$ is selected from a linear or branched $C_1$ to $C_{10}$ alkyl group; and providing a plasma source into the reactor to at least partially react the first and second compounds to form a flowable liquid or oligomer, wherein the flowable liquid or oligomer at least partially fills a portion of the surface feature.

The above steps define one cycle for the methods described herein; and the cycle can be repeated until the desired thickness of a silicon-containing film is obtained. In one particular embodiment, the substrate temperatures is about 100° C. or less to keep the resulting polymeric polysilazane species having small molecular weight than those formed at higher temperatures, thus more flowable to allow smaller features being filled. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film. In certain embodiments, after the silicon containing film is deposited, the substrate is optionally treated with an oxygen-containing source under certain process conditions sufficient to make the silicon nitride or silicon carbide film form a silicon oxide, a silicon oxynitride, or carbon doped silicon oxide film. The oxygen-containing source can be selected from the group consisting of water ($H_2O$), oxygen ($O_2$), hydrogen peroxide ($H_2O_2$), oxygen plasma, ozone ($O_3$), NO, $N_2O$, carbon monoxide (CO), carbon dioxide ($CO_2$), $N_2O$ plasma, carbon monoxide (CO) plasma, carbon dioxide ($CO_2$) plasma, and combinations thereof.

In any of the above or in an alternative embodiment, the flowable liquid or oligomer is treated at one or more temperatures ranging from about 100° C. to about 1000° C. to density at least a portion of the materials.

In some embodiments, the post thermal treatment materials are exposed to a plasma, infrared lights, chemical treatment, an electron beam, or UV light to form a dense film. In one embodiment of the invention, a post treatment comprising exposure to UV light exposure is conducted under conditions to emit hydrocarbon, or silane gaseous by-products to densify the dielectric film.

In certain embodiments, the resultant silicon carbide or silicon carbonitride containing films or coatings can be exposed to a post-deposition treatment such as, but not limited to, a plasma treatment, chemical treatment, ultraviolet light exposure, vacuum UV exposure, eximer laser exposure, electron beam exposure, and/or other treatments to affect one or more properties of the film. In one particular embodiment of the method described herein, a plasma comprising hydrogen can be employed as post-deposition treatment to the as-deposited silicon nitride film to increase the density as well as decrease the etch rate. The plasma comprising hydrogen is selected from the group consisting of hydrogen plasma, hydrogen/helium, hydrogen/argon plasma, hydrogen/neon plasma and mixtures thereof.

In certain embodiments, the silicon carbide or silicon carbonitride containing films described herein have a dielectric constant of 6 or less. In these or other embodiments, the films can a dielectric constant of about 5 or below, or about 4 or below, or about 3.5 or below as measured by mercury probe technique. However, it is envisioned that films having other dielectric constants (e.g., higher or lower) can be formed depending upon the desired end-use of the film. An example of the silicon carbide or silicon carbonitride film that is formed using the silacycloalkane precursors and processes described herein has the formulation $Si_xO_yC_zN_vH_w$ wherein Si ranges from about 10% to about 50%; O ranges from about 0% to about 10%; C ranges from about 0% to about 20%; N ranges from about 10% to about 75% or from about 10% to 60%; and H ranges from about 0% to about 10% atomic percent weight % wherein x+y+z+v+w=100 atomic weight percent, as determined for example, by x-ray photoelectron spectroscopy (XPS) or secondary ion mass spectrometry (SIMS).

In one particular embodiment wherein the film is depositing using a plasma comprising a noble gas, the silicon nitride film comprises from about 5% to about 50% carbon atomic weight percent, as determined for example, by XPS or other means. In this particular embodiment, the silicon nitride film further comprises wherein Si ranges from about 10% to about 40%; O ranges from about 0% to about 5%; N ranges from about 10% to about 75% or from about 10% to 50%; and H ranges from about 0% to about 10% atomic percent weight % wherein the total weight percent of the film adds up to 100 atomic weight percent.

Throughout the description, the term "dielectric film" as used herein refers to a film selected from the group consisting of stoichiometric or non-stoichiometric silicon carbide, silicon carbonitride, silicon carboxynitride, and there mixture thereof.

Throughout the description, the term "metal alkyl" as used herein refers to a reagent having at least one metal-carbon bond such as $MR^2$ wherein M is a metal selected from Li, Na, K or $XMR^2$ wherein X=Cl, Br, or I, M=Mg or Ca.

As mentioned previously, the method described herein may be used to deposit a silicon nitride film on at least a portion of a substrate. Examples of suitable substrates include but are not limited to, silicon, silicon/germanium, germanium, III/V materials, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, a flexible substrate such as IGZO, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nano-electromechanical systems, thin film transistor (TFT), light emitting diodes (LED), organic light emitting diodes (OLED), IGZO, and liquid crystal displays (LCD).

The following examples illustrate the method for depositing silicon nitride films described herein and are not intended to limit it in any way the claims appended hereto.

EXAMPLES

In the following examples, unless stated otherwise, properties were obtained from sample films that were deposited onto medium resistivity (14-17 Ω·cm) single crystal silicon wafer substrates. All film depositions were performed using the commercial reactor has showerhead design with 13.56 MHz direct plasma. In typical process conditions, unless stated otherwise, the chamber pressure was fixed at a pressure ranging from about 1 to about 10 Torr. Additional inert gas was used to maintain chamber pressure. The silacycloalkane precursor was delivered using vapor draw (i.e. no argon used at all). Typical RF power used was 125 W over electrode area of 150 mm wafer to provide a power density of 0.7 W/cm². The film depositions comprised the steps listed in Table 1 for thermal ALD and plasma enhanced ALD, respectively. Steps 1 through 4 in Table 1 constitute one PEALD cycle and were repeated, unless otherwise specified, a total of 300 times to get the desired film thickness.

TABLE 1

Steps used in PEALD silicon carbide films

| Step | |
|---|---|
| A | Introduce a silacycloalkane precursor to the reactor; additional inert gas is used to maintain chamber pressure to provide a chemisorbed layer |
| B | Purge the silacycloalkane precursor from the reactor chamber with inert gas |
| C | Activate a plasma to react with the surface of the chemisorbed layer and create reactive sites |
| D | Purge unreacted plasma species out |

The reactive index (RI) and thickness for the deposited films were measured using an ellipsometer. Film non-uniformity was calculated using the standard equation: % non uniformity=((max thickness−min thickness)/(2*average (avg) thickness)). Film structure and composition were analyzed using Fourier Transform Infrared (FTIR) spectroscopy and X-Ray Photoelectron Spectroscopy (XPS). The density for the films was measured with X-ray Reflectometry (XRR).

Example 1: Synthesis of Synthesis of 1,1,3,3-tetravinyl-1,3-disilacyclobutane

Vinyl magnesium chloride solution in THF (4 L, 1.6M) was charged into a 12 L flask equipped with a mechanical stirrer, thermowell, condenser and an addition funnel. 1,1,3,3-tetrachloro-1,3-disilacyclobutane (339.0 g 1.5 mol) solution in hexanes (500 mL) was added slowly to the flask, in an addition rate that the reaction temperature was kept below 60° C. After the addition was complete, the flask was heated to 60° C. for 4 hours, and cooled down to room temperature. With stirring, cold water (1.5 L) was added slowly via an addition funnel to the flask. Two liquid layers formed. The organic layer was separated and dried over Na$_2$SO$_4$. After removal of the solvents by distillation, the product was distilled under vacuum. 185.0 g product was obtained, yield: 65.4%. The normal boiling point measured with DSC was 201.5° C.

Example 2: Synthesis of 1,3-divinyl-1,3-dimethyl-1,3-disilacyclobutane

Vinyl magnesium chloride solution in THF (3 L, 1.6M) was charged into a 12 L flask equipped with a mechanical stirrer, thermowell, condenser and an addition funnel. 1,3-diethoxy-1,3-dimethyl-1,3-disilacyclobutane (408.0 g 2.0 mol) in hexanes (500 mL) was added slowly to the flask, in an addition rate that the reaction temperature was kept below 60° C. After the addition was complete, the flask was heated to 60° C. for 4 hours, and cooled down to room temperature. With stirring, cold water (1.5 L) was added slowly via an addition funnel to the flask. Two liquid layers formed. The organic layer was separated and dried over Na$_2$SO$_4$. After removal of the solvents by distillation, the product was distilled under vacuum. 261.5 g product with b.p. 62° C./20 mmHg was obtained, yield: 78.0%.

Example 3: PEALD Silicon Carbide Film Using 1,3-Divinyl-1,3-dimethyl-silacyclobutane and Hydrogen Plasma (Prophetic)

The silicon wafer is loaded into the commercial reactor equipped with showerhead design with 13.56 MHz direct plasma and heated to 300° C. with chamber pressure of 2 torr. 1,3-divinyl-1,3-dimethyl-silacyclobutane as silacycloalkane precursor is delivered using vapor draw at temperature of 72° C. into the reactor. The ALD cycle is comprised of the process steps provided in Table 1 and uses the following process parameters:
a. Introduce a silacycloalkane precursor to the reactor
   Nitrogen flow: 1000 sccm
   Silacycloalkane precursor pulse: 1 second
b. Inert gas purge
   Nitrogen flow: 1000 sccm
   Purge time: 10 seconds
c. Introduce hydrogen plasma
   Hydrogen flow: 1000 sccm
   Hydrogen plasma pulse: 10 second with plasma power of 125 W
d. Purge
   Nitrogen flow: 1000 sccm
   Purge time: 10 seconds
Steps a to d were repeated for 500 cycles to provide a silicon carbide film.

Example 4: PEFCVD of Silicon Carbide Films Using 1,1,3,3-tetravinyl-1,3-disilacyclobutane The silicon wafer was loaded into the commercial reactor equipped with a dual plenum showerhead design and a microwave based remote plasma source. 1,1,3,3-tetravinyl-1,3-disilacyclobutane as a silacycloalkane precursor is delivered through a liquid flow meter and heated injector to deliver vapor into the process chamber through holes in the showerhead that are independent of the delivery of free radical generated by the remote plasma source from the dissociation of ammonia (NH$_3$). Process conditions used to deposit flowable films are:

| | |
|---|---|
| Microwave Plasma Power | 2000 W |
| Pressure | 1 torr |
| Precursor Flow | 2000 mg/min |
| He Carrier Flow | 100 sccm |
| $NH_3$ Flow through RPS | 500 sccm |
| Substrate Temp | 12° C. |
| Deposition Time | 120 sec |

After deposition the films are cured by transferring the wafer, without vacuum break, to an annealing chamber where it was annealed at 300° C. for 5 minutes, then transferred to another chamber where it was cured with UV exposure at susceptor temperature of 400° C. for 10 minutes. The resulting film can be seen in FIG. 1, where the flowable silicon carbide was shown to fully fill the feature from the bottom up with a planar overburden above the feature. The films shown in FIG. 1 had the following composition as determined by X-Ray Photoelectron Spectroscopy (XPS): carbon 74.0 at. %, nitrogen <1.0 at. %, oxygen 5.0 at. %, and silicon 20.0 at. %. It is unexpected that ammonia was used as a remote plasma source but the resulting film had less than 1.0 at. % of nitrogen.

The precursor had a carbon to silicon ratio of 5:1. The deposited and cured film had a carbon to silicon ration of <4:1. The precursor combined with process conditions deployed allowed for reduction in the total carbon content of the film relative to precursor.

Although certain principles of the invention have been described above in connection with aspects or embodiments, it is to be clearly understood that this description is made only by way of example and not as a limitation of the scope of the invention.

The invention claimed is:

1. A method of forming a dielectric film comprising silicon and carbon onto at least a surface of a substrate, the method comprising the steps of:
   a. providing a substrate in a reactor;
   b. introducing into the reactor at least one silacycloalkane precursor selected from the group consisting of compounds represented by the structure of Formula IA and compounds represented by the structure of Formula IB:

IA
   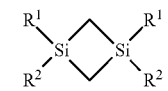

IB
   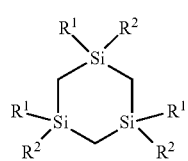

wherein $R^1$ is selected from the group consisting of hydrogen, a linear or branched $C_1$ to $C_{10}$ alkyl group, a cyclic $C_3$ to $C_{10}$ alkyl group, a linear or branched $C_2$ to $C_{10}$ alkenyl group, and a linear or branched $C_2$ to $C_{10}$ alkynyl group; and $R^2$ is selected from the group consisting of a linear or branched $C_2$ to $C_6$ alkenyl group, a linear or branched $C_2$ to $C_6$ alkynyl group, and a cyclic $C_3$ to $C_{10}$ alkyl group, wherein the at least one silacycloalkane precursor reacts on at least a portion of the surface of the substrate to provide a chemisorbed layer;
   c. purging the reactor with a purge gas;
   d. introducing a plasma containing source and an inert gas into the reactor to react with at least a portion of the chemisorbed layer and provide at least one reactive site, wherein the plasma is generated at a power density ranging from about 0.01 to about 1.5 $W/cm^2$; and
   e. optionally purging the reactor with an inert gas; and wherein the steps b through e are repeated until a desired thickness of the dielectric film is obtained.

2. The method of claim 1 wherein the at least one silacycloalkane precursor is selected from the group consisting of 1,3-divinyl-1,3-disilacyclobutane, 1,3-divinyl-1,3-dimethyl-1,3-disilacyclobutane, 1,1,3,3-tetravinyl-1,3-disilacyclobutane, 1,3,5-trivinyl-1,3,5-trisilacyclohexane, 1,3,5-trivinyl-1,3,5-trimethyl-1,3,5-trisilacyclohexane, 1,1,3,3,5,5-hexavinyl-1,3,5-trisilacyclohexane, 1,3-diallyl-1,3-disilacyclobutane, 1,3-diallyl-1,3-dimethyl-1,3-disilacyclobutane, 1,1,3,3-tetraallyl-1,3-disilacyclobutane, 1,3,5-triallyl-1,3,5-trisilacyclohexane, 1,3,5-triallyl-1,3,5-trimethyl-1,3,5-trisilacyclohexane, 1,1,3,3,5,5-hexaallyl-1,3,5-trisilacyclohexane, 1,3-diacetylenyl-1,3-disilacyclobutane, 1,3-diacetylenyl-1,3-dimethyl-1,3-disilacyclobutane, 1,1,3,3-tetraacetylenyl-1,3-disilacyclobutane, 1,3,5-triacetylenyl-1,3,5-trisilacyclohexane, 1,3,5-triacetylenyl-1,3,5-trimethyl-1,3,5-trisilacyclohexane, 1,1,3,3,5,5-hexaacetylenyl-1,3,5-trisilacyclohexane 1,3-dicyclopropyl-1,3-disilacyclobutane, 1,3-dicyclopropyl-1,3-dimethyl-1,3-disilacyclobutane, 1,1,3,3-tetracyclopropyl-1,3-disilacyclobutane and combinations thereof.

3. The method of claim 1 the plasma containing source is selected from the group consisting of hydrogen plasma, hydrogen/helium, hydrogen/argon plasma, hydrogen/neon plasma, helium plasma, argon plasma, neon plasma, and mixtures thereof.

4. The method of claim 1 wherein the dielectric film has a density of 2.2 g/cc or greater.

5. The method of claim 1 wherein the method is at least one vapor deposition process selected from the group consisting of plasma enhanced atomic layer deposition, plasma enhanced cyclic chemical vapor deposition, and plasma enhanced flowable chemical vapor deposition.

6. The method of claim 1 wherein the method is conducted at one or more temperatures of about 400° C. or less.

7. The method of claim 1 wherein the method is conducted at one or more temperatures of about 300° C. or less.

8. A method of forming a silicon carbide or silicon carbonitride film onto at least a surface of a substrate, the method comprising the steps of:
   a. providing a substrate in a reactor;
   b. introducing into the reactor at least one silacycloalkane precursor selected from the group consisting of 1,3-divinyl-1,3-disilacyclobutane, 1,3-divinyl-1,3-dimethyl-1,3-disilacyclobutane, 1,1,3,3-tetravinyl-1,3-disilacyclobutane, 1,3,5-trivinyl-1,3,5-trisilacyclohexane, 1,3,5-trivinyl-1,3,5-trimethyl-1,3,5-trisilacyclohexane, 1,1,3,3,5,5-hexavinyl-1,3,5-trisilacyclohexane, 1,3-diallyl-1,3-disilacyclobutane, 1,3-diallyl-1,3-dimethyl-1,3-disilacyclobutane, 1,1,3,3-tetraallyl-1,3-disilacyclobutane, 1,3,5-triallyl-1,3,5-trisilacyclohexane, 1,3,5-triallyl-1,3,5-trimethyl-1,3,5-trisilacyclohexane, 1,1,3,3,5,5-hexaallyl-1,3,5-trisilacyclohexane, 1,3-diacetylenyl-1,3-disilacyclobutane, 1,3-diacetylenyl-1,3-dimethyl-1,3-disilacyclobutane, 1,1,3,3-tetraacetylenyl-1,3-disilacyclobutane, 1,3,5-triacetylenyl-1,3,5-trisilacyclohexane, 1,3,5-triacetylenyl-1,3,5-trimethyl-1,3,5-trisilacyclohexane, 1,1,3,3,5,5-hexaacetylenyl-1,3,5-trisilacyclohexane 1,3-dicyclopropyl-1,3-disilacyclobutane, 1,3-dicyclopropyl-1,3-dimethyl-1,3-disilacyclobutane, 1,1,3,3-tetracyclopropyl-1,3-disilacyclobutane,
and combinations thereof, wherein the at least one silacycloalkane reacts on at least a portion of the surface of the substrate to provide a chemisorbed layer;

c. purging the reactor with a purge gas comprising at least one selected from nitrogen, a noble gas, and combinations thereof;

d. introducing a plasma containing source into the reactor to react with at least a portion of the chemisorbed layer and provide an at least one reactive site wherein the plasma is generated at a power density ranging from about 0.01 to about 1.5 W/cm$^2$; and e. optionally purging the reactor with an inert gas; and wherein the steps b through e are repeated until a desired thickness of the silicon nitride film is obtained.

9. The method of claim 8 wherein the silicon carbide or silicon carbonitride film has a density of 2.2 g/cc or greater.

10. The method of claim 8 wherein method is a vapor deposition process selected from the group consisting of plasma enhanced atomic layer deposition, plasma enhanced cyclic chemical vapor deposition, and plasma enhanced flowable chemical vapor deposition.

11. The method of claim 8 wherein the method is conducted at a temperature of 400° C. or less.

12. The method of claim 8 wherein the method is conducted at a temperature of 300° C. or less.

13. The method of claim 8 wherein the method is conducted at a temperature of 100° C. or less.

14. The method of claim 8 where the plasma containing source is selected from the group consisting of hydrogen plasma, hydrogen/helium, hydrogen/argon plasma, hydrogen/neon plasma, helium plasma, argon plasma, neon plasma, nitrogen/argon plasma, ammonia plasma, nitrogen/ammonia plasma, ammonia/helium plasma, ammonia/argon plasma, ammonia/nitrogen plasma, NF$_3$ plasma, organoamine plasma, and mixtures thereof.

15. A method for depositing a dielectric film comprising silicon and carbon via plasma enhanced flowable chemical vapor deposition, the method comprising the steps of:

placing a substrate comprising a surface feature into a reactor which is at one or more temperatures ranging from −20° C. to about 200° C.;

introducing into the reactor at least one silacycloalkane precursor selected from the group consisting of compounds represented by the structure of Formula IA and compounds represented by the structure of Formula IB:

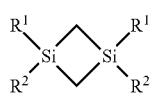

IA

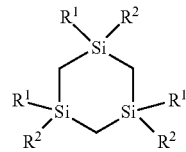

IB wherein R$^1$ is selected from the group consisting of hydrogen, a linear or branched C$_1$ to C$_{10}$ alkyl group, cyclic C$_3$ to C$_{10}$ alkyl group, a linear or branched C$_2$ to C$_{10}$ alkenyl group, and a linear or branched C$_2$ to C$_{10}$ alkynyl group; and R$^2$ is selected from the group consisting of a linear or branched C$_2$ to C$_6$ alkenyl group, a linear or branched C$_2$ to C$_6$ alkynyl group, and a cyclic C$_3$ to C$_{10}$ alkyl group; and providing a plasma source into the reactor to at least partially react the at least one silacyloalkane precursor to form a flowable liquid, wherein the flowable liquid at least partially fills a portion of the surface feature.

16. The method of claim 15 wherein the at least one silacycloalkane precursor is selected from the group consisting of 1,3-divinyl-1,3-disilacyclobutane, 1,3-divinyl-1,3-dimethyl-1,3-disilacyclobutane, 1,1,3,3-tetravinyl-1,3-disilacyclobutane, 1,3,5-trivinyl-1,3,5-trisilacyclohexane, 1,3,5-trivinyl-1,3,5-trimethyl-1,3,5-trisilacyclohexane, 1,1,3,3,5,5-hexavinyl-1,3,5-trisilacyclohexane, 1,3-diallyl-1,3-disilacyclobutane, 1,3-diallyl-1,3-dimethyl-1,3-disilacyclobutane, 1,1,3,3-tetraallyl-1,3-disilacyclobutane, 1,3,5-triallyl-1,3,5-trisilacyclohexane, 1,3,5-triallyl-1,3,5-trimethyl-1,3,5-trisilacyclohexane, 1,1,3,3,5,5-hexaallyl-1,3,5-trisilacyclohexane, 1,3-diacetylenyl-1,3-disilacyclobutane, 1,3-diacetylenyl-1,3-dimethyl-1,3-disilacyclobutane, 1,1,3,3-tetraacetylenyl-1,3-disilacyclobutane, 1,3,5-triacetylenyl-1,3,5-trisilacyclohexane, 1,3,5-triacetylenyl-1,3,5-trimethyl-1,3,5-trisilacyclohexane, 1,1,3,3,5,5-hexaacetylenyl-1,3,5-trisilacyclohexane 1,3-dicyclopropyl-1,3-disilacyclobutane, 1,3-dicyclopropyl-1,3-dimethyl-1,3-disilacyclobutane, 1,1,3,3-tetracyclopropyl-1,3-disilacyclobutane and combinations thereof.

17. The method of claim 15 wherein the deposition process is a plasma enhanced chemical vapor deposition and the plasma is generated in situ.

18. The method of claim 15 wherein the deposition process is a plasma enhanced chemical vapor deposition and the plasma is generated remotely.

19. The method of claim 15 wherein the deposition process is a plasma enhanced chemical vapor deposition and the plasma comprises dual plasma sources wherein one source is generated in situ and one source is generated remotely.

20. The method of claim 15 wherein the reactor which is at one or more temperatures ranging from −20° C. to about 100° C.

21. The method of claim 15 wherein the flowable liquid comprises at least one oligomer.

* * * * *